United States Patent [19]

May

[11] Patent Number: 4,928,258

[45] Date of Patent: May 22, 1990

[54] RECURSIVE MEDIAN FILTERING

[75] Inventor: Roger A. May, Winter Park, Fla.

[73] Assignee: The United States of America as represented by the Secretary of the Air Force, Washington, D.C.

[21] Appl. No.: 349,558

[22] Filed: May 8, 1989

[51] Int. Cl.[5] .............................................. G06F 15/31
[52] U.S. Cl. ........................... 364/724.17; 364/724.19; 364/724.13
[58] Field of Search ...................... 364/724.17, 724.13, 364/724.19

[56] References Cited

U.S. PATENT DOCUMENTS

| | | | |
|---|---|---|---|
| 4,450,533 | 5/1984 | Petit et al. ........................ | 364/724.13 |
| 4,521,866 | 6/1985 | Petit et al. ........................ | 364/724.1 |
| 4,539,690 | 9/1985 | Speidel ........................... | 364/724.2 X |
| 4,569,031 | 2/1986 | Backes ............................. | 364/724.01 |
| 4,583,234 | 4/1986 | Ramadan ........................ | 364/724.2 X |
| 4,588,979 | 5/1986 | Adams ............................. | 341/131 |
| 4,809,207 | 2/1989 | Nillesen .......................... | 364/724.03 |

Primary Examiner—Gary V. Harkcom
Assistant Examiner—Tan V. Mai
Attorney, Agent, or Firm—Bernard E. Franz; Donald J. Singer

[57] ABSTRACT

This technique involves digitally filtering data by determining the median of data values instead of mean or some other algebraic combination. It is unique in that the data used for the median calculation utilizes previous as well as the new data. This filter structure can be used in both time domain and spatial domain. Also, the filter size can easily be varied to permit adapting its size to system gain.

9 Claims, 4 Drawing Sheets

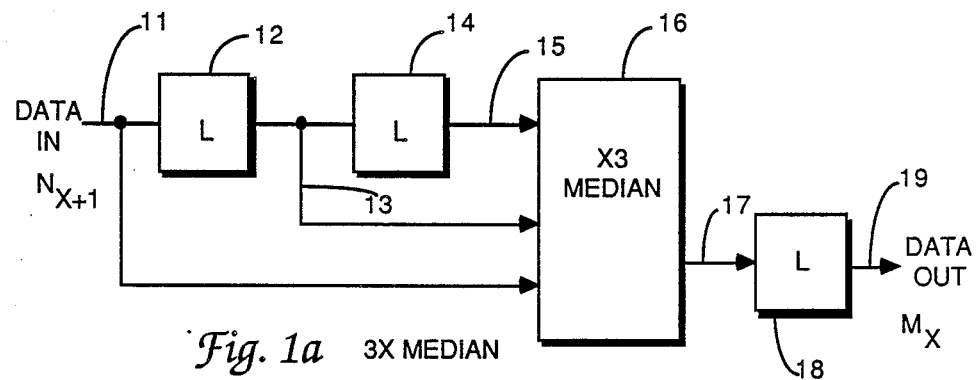
Fig. 1a 3X MEDIAN
PRIOR ART
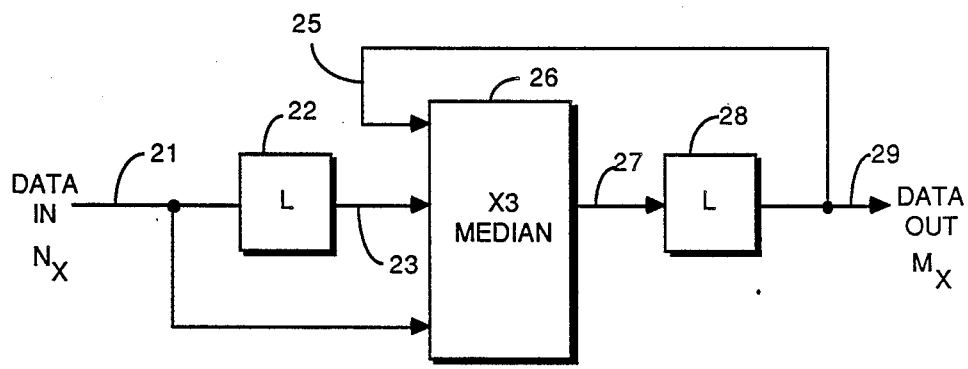
Fig. 1b 3X MEDIAN 1X RECURSIVE

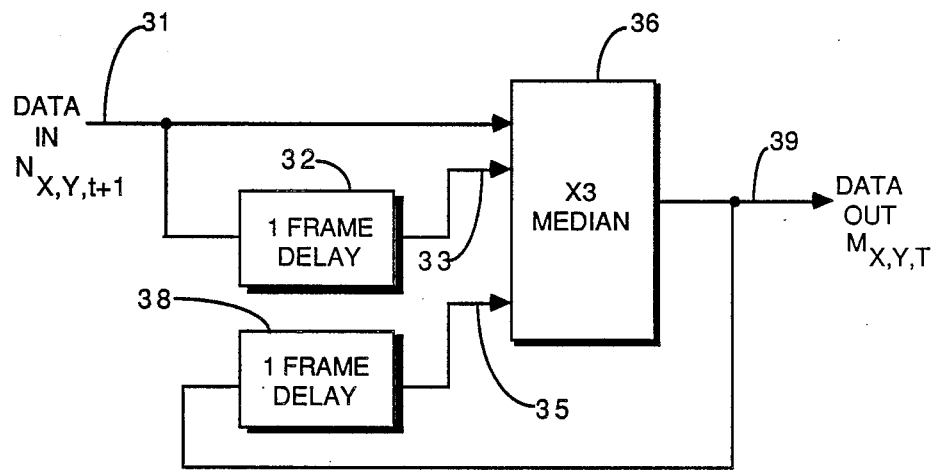
Fig. 2 3X MEDIAN 1X RECURSIVE FRAME INTERGRATION
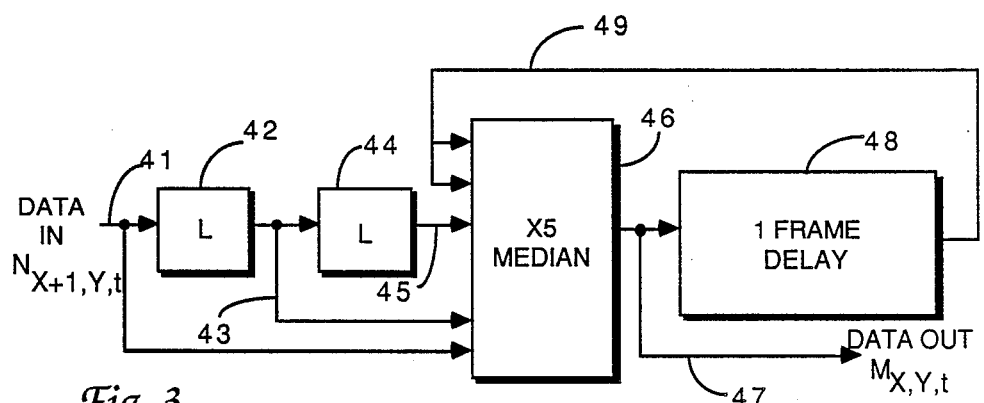
Fig. 3
5X MEDIAN 1X RECURSIVE DOUBLE WEIGHTED FRAME INTERGRATION

5X MEDIAN 1X RECURSIVE

5X MEDIAN 2X RECURSIVE

5X MEDIAN 1X RECURSIVE DOUBLE WEIGHTED

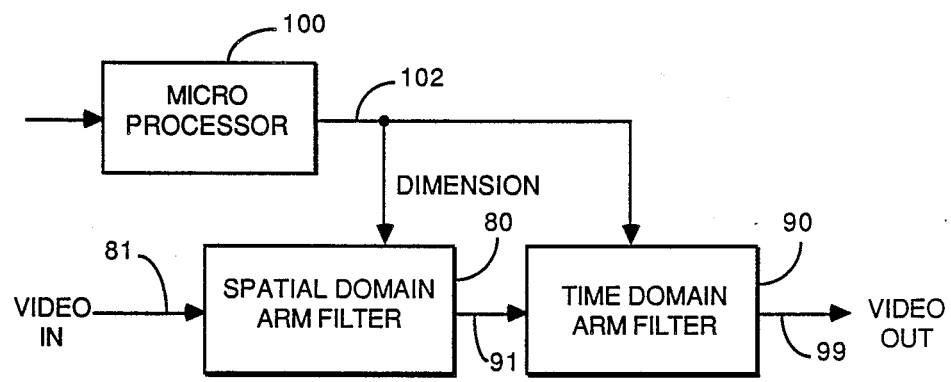
*Fig. 5a* IDEAL FILTER - DUAL DOMAIN ARM FILTER
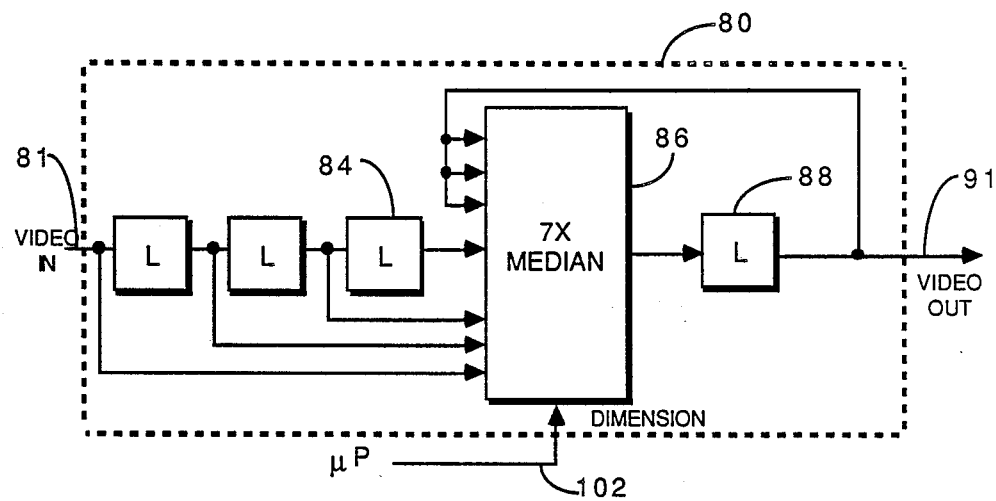
*Fig. 5b* SPATIAL DOMAIN ARM FILTER
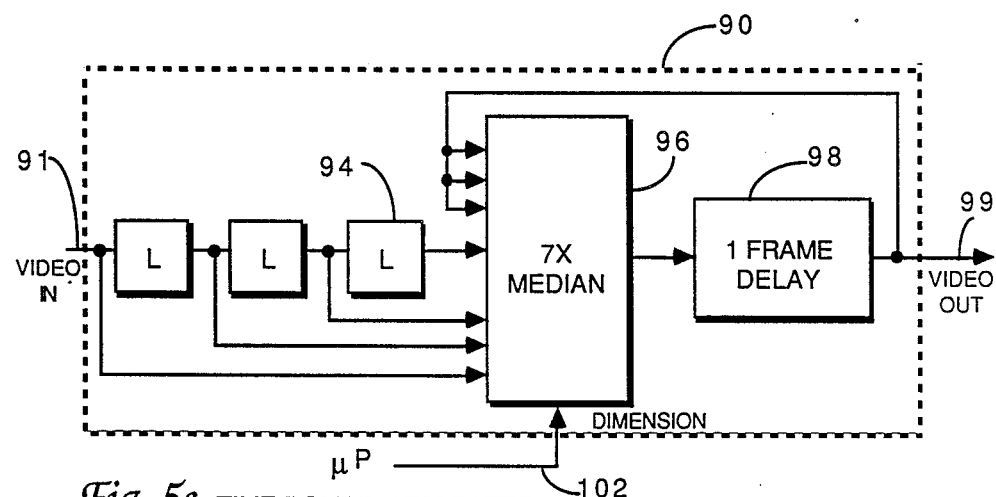
*Fig. 5c* TIME DOMAIN ARM FILTER

RECURSIVE MEDIAN FILTERING

RIGHTS OF THE GOVERNMENT

The invention described herein may be manufactured and used by or for the Government of the United States for all governmental purposes without the payment of any royalty.

BACKGROUND OF THE INVENTION

The present invention relates generally to recursive median filtering, and more particularly to filtering for digital imaging data.

Digital filters are used for signal processing in applications such as pulse code modulation (PCM) of voice signals, and digitally coded video signals. One field is FLIR (Forward Looking InfraRed) used on aircraft for navigation and targeting, particularly at night. FLIR imaging data typically has very small signal levels and a great need exists to improve signal to noise ratio.

Median filtering is a common image signal processing filtering technique. Its non-algebraic basis can provide a better filtering result under many conditions. Algebraic techniques such as linearly combining adjacent samples result in loss of high frequency signal content. Median filtering does not combine values but rather attempts to logically select the best data sample among the samples available and therefore more faithfully recreates the original signal.

United States patents of interest include No. 4,521,866 (Petit), which teaches a recursive digital filter comprising a recursive part in which there are circulating registers and a non-recursive part having serially connected registers. No. 4,539.690 (Speidel) also teaches a digital filter having a recursive part and a non recursive part. No. 4,583,234 (Ramadan) teaches a feedback circuit to provide enhanced amplitude bit information.

SUMMARY OF THE INVENTION

An objective of the invention is to provide for filtering with improved signal to noise ratio, particularly for data having very small signal levels. A further objective is to provide for improved filtering of FLIR imaging data.

With the median filtering signal processing filtering technique the best data sample is selected among available data. The beneficial effects of median filtering are further enhanced in this invention by configuring the filter to permit a simultaneous use of both median and algebraic filtering. The selected best sampled data obtained with median filtering is combined with data obtained by algebraic filtering in order to achieve the advantages of both types of filtering techniques. One embodiment of the invention described as the 3X recursive median method selects the median value from the two nearest data samples but also uses the result of the median for the previous data point. The use of past history has the effect of using data more highly filtered as the input to the decision block. The invention teaches other embodiments of recursive filtering which by iterative means reduces the digital noise level to a very low ratio. The 3X median recursive method provides an input signal $N_x$ which is applied to a delay block L and 3X median block. The output from the 3X median block provides a signal $N_x$, $N_{x-1}$, $M_{x-1}$. The output $M_x$ is fed back to the input of the 3X median block to provide the signal $M_{x-1}$.

This concept involves digitally filtering data by determining the median of data values instead of mean or some other algebraic combination. It is unique in that the data used for the median calculation utilizes previous results as well as the new data. This filter structure can be used in both time domain and spatial domain. Also, the filter size can easily be varied to permit adapting its size to system gain.

Advantages.

The filter is compact since large filter dimensions are simple to implement. Variable filter dimension is easy to implement, thus making adaptive filtering attractive. Also, the signal to noise improvement for a given filter size provides greater noise reduction than common finite impulse response filters. Finally, frame integration can be implemented with virtually no smearing of moving objects.

BRIEF DESCRIPTION OF THE DRAWING

FIG. 1a is a block diagram showing a prior art median filter;

FIG. 1b is a block diagram showing a 3X median 1X recursive filter;

FIG. 2 is a block diagram showing a 3X median 1X recursive frame integration filter;

FIG. 3 is a block diagram showing a 5X median 1X recursive double weighted frame integration filter;

FIG. 5a is a block diagram showing a dual domain adaptive recursive median filter;

FIG. 5b is a block diagram showing a spatial domain adaptive recursive median filter which is one of the blocks of FIG. 5a; and FIG. 5c is a block diagram showing a time domain adaptive recursive median filter which is one of the blocks of FIG. 5a.

DETAILED DESCRIPTION

Figure 4A:
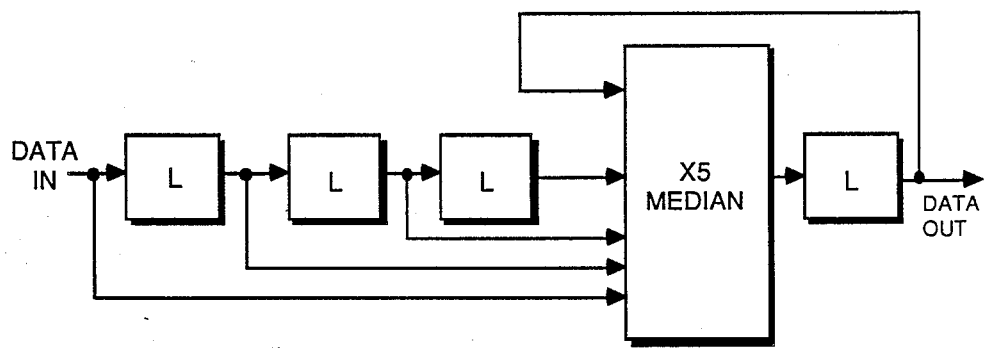
FIG. 4a is a block diagram showing a 5X median 1X recursive filter.

My copending patent application Ser. No. 07/173,859 filed March 15, 1988 titled "Automatic Target Detection and Recognition" (hereby incorporated by reference) covers a target screener using a segment labeler/extractor with data from an electronic warfare sensor such as FLIR (Forward Looking InfraRed) imagery; in a Low Altitude Navigation and Targeting InfraRed for Night (LANTIRN) system. Filtering using the present invention may be used in conjunction with that system to provide data with an improved signal to noise ratio.

RECURSIVE MEDIAN FILTERING

Median filtering is a common image signal processing filtering technique. Its non algebraic basis can provide a better filtering result under many conditions. Algebraic techniques such as linearly combining adjacent samples results in loss of high frequency signal content. Median filtering does not combine values but rather attempts to logically select the best data sample among the samples available and therefore more faithfully recreates the original signal. The beneficial effects of median filtering are further enhanced in this invention by configuring the filter to permit a simultaneous use of both median and algebraic filtering.

The first of these architectures is called recursive median filtering. A median filter and a recursive median filter block diagram are shown in FIGS. 1a and 1b. The 3X median filter of FIG. 1a merely always selects the middle value from the three nearest neighbors and is a common filtering technique in the prior art.

To explain the notation used in the description, consider the form of digital data using pulse amplitude modulation for example. With voice signals the waveform is sampled at fixed intervals with a sampling rate equal to at least twice the highest frequency to be transmitted. The amplitude of each sample is then encoded in a binary code, usually with some form of pulse compression in accordance with a given law. For imaging data, a camera or other input device captures the image a frame at a time at fixed frame intervals. Each frame is then scanned in a number of horizontal rows, each row being scanned from left to right with a given number of pixels in each row. The scanning makes use of a clock to count the pixels across each row and the position of the pixel may be designated as X. At the end of each row scan, another clock counter may be advanced to determine a row vertically, with the row designated by a value Y. At the end of each frame, a frame counter is advanced to designate the frame by a value t. During the scanning process, each pixel is digitized with a given number of binary digits (bits), a typical number being eight bits. The data may be output either in serial form one bit at a time, or in parallel form one pixel at a time with a lead for each bit.

In the drawings, the devices shown as "L" are delay devices in which a pixel of data is input and appears at its output one pixel time slot later in the scan of a horizontal row. These devices could, for example, be registers having a flip flop for each bit of a pixel, with data clocked in and out by the row clock. In FIG. 1a, a pixel of data at the data input line 11 appears at the input of device 12, and one pixel time slot later this data appears at the output of device 12 on line 13. The data on line 13 is applied at the input of device 14, and another pixel time slot later appears at the output on line 15. If the data on line 13 is designated as $N_X$, then that on line 11 at the same time is for the pixel $N_{X+1}$ to the right in the row, and that on line 15 is for the pixel $N_{X-1}$ to the left in the row.

A device 16 provides comparison logic for selecting the median pixel value from inputs on lines 11, 13 and 15, and outputting the result on line 17 to a register 18, with the data out from register 18 to line 19 one pixel time slot later designated $M_X$. The result is expressed as $M_X=[N_{X+1},N_X,N_{X-1}]_{MEDIAN}$. In other words, (1)
if $N_{X+1} \geq N_X \geq N_{X-1}$, (2)
or $N_{X-1} \geq N_X \geq N_{X+1}$, then $M_X=N_X$; (3)
or if $N_X \geq N_{X+1} \geq N_{X-1}$, (4)
or $N_{X-1} \geq N_{X+1} \geq N_X$, then $M_X=N_{X+1}$; (5)
or if $N_X \geq N_{X-1} \geq N_{X+1}$, (6)
or if $N_{X+1} \geq N_{X-1} 24 N_X$, then $M_X=N_{X-1}$. (7)

For an imaging system, the registers or delay devices 12, 14 and 18 and the X counter would need to be reset at the end of each row scan. For a PCM voice system, there would be an indefinite string of pixels.

The 3X recursive median (or 3X median 1X recursive) filter of FIG. 1b selects the middle value from the two nearest samples but also uses the result of the median for the previous data point. This use of past history has the effect of using data more highly filtered as input to the decision block and is the essence of this invention. Maximum filter size is determined by allowable hardware physical size and by the high frequency effects permittable on the signal. For the same size filter, greater filtering can be achieved with recursive filtering. As in FIG. 1a, the filter of FIG. 1b has a selection device 26 having three inputs of pixel data, and selects the median value for output via line 27 and a delay register 28 to a data-out line 29. One of the inputs is directly from a data-in line 21, and another from line 21 via a delay device or register 22 to line 23. However, the third input is from the output of register 28 via line 25 to provide a recursive input. If the input at line 21 is designated $N_X$, then that at line 23 represents the pixel $N_{X-1}$. Although the pixel data from the output of register 28 is designated $M_X$ at line 29, with respect to the pixel $N_X$ it represents $M_{X-1}$. The filter therefore provides the function $M_X=[N_X,N_{X-1},M_{X-1}]_{MEDIAN}$.

The use of previous filtered results is the unique aspect of this invention.

The most obvious application of the median recursive filter is a spatial domain image filter. This filter would operate, for instance, on a horizontal line of data. The recursive data sample would be obtained from the median filter results of the previous sample on the line. Thus, all filtering would be across the horizontal line which represents spatial image position.

A variation to this configuration results in time domain filtering. In this option, the consecutive data is defined as the data obtained by sequential samples at the same position. FIG. 2 illustrates this architecture, which can be considered a form of frame integration. Note that each level of time integration requires one frame of memory a significant hardware impact. In FIG. 2 there are two such memory units 32 and 38, each of which has storage for all of the pixels of a frame. The data in on line 31 may be designated $N_{X,Y,t+1}$, where X,Y define a pixel position within a frame, and t defines a frame number. As each pixel of data arrives, the X and Y clocks are used to address the memories 32 and 38. The pixel from line 31 is stored in the memory 32, while the stored pixel from the same location is read out to line 33. The pixel on line 33 is then $N_{X,Y,t}$. The selection unit J6 performs the same logic function in selecting the median as the selection unit in FIG. 1a. The output on line 39 is then designated $M_{X,Y,t}$. This value is stored in memory unit 38, and the value read out from the preceding frame is $N_{X,Y,t-1}$. The data out on line 39 is given by the function $M_{X,Y,t}=[N_{X,Y,t+1},N_{X,Y,t},N_{X,Y,t-1}]_{MEDIAN}$ A hybridization of all these techniques has been built and tested. FIG. 3 shows this configuration. The data samples are spatially consecutive data while the recursive data are time consecutive. Hardware is minimized since only one frame of delay is required while the effects of a five wide median recursive filter are obtained. The select logic unit 46 is similar to the unit 16 of FIG. 1a, except that it selects the median pixel value from five inputs. The input from line 41 via delay units 42 and 43 is similar to the input via units 12 and 14 in FIG. 1a, to provide pixels at lines 41. 43 and 45 designated $N_{X+1,Y,t}$, $N_{X,Y,t}$ and $N_{X-1,Y,t}$. The one-frame delay memory unit 48 is like the unit 38 of FIG. 2, with its output via line 49 used as two inputs designated $M_{X,Y,t-1}$ to the select unit 46 for double weighting. The output on line 47 is then the function $$M_{X,Y,t}=[N_{X+1,Y,t},N_{X,Y,t},N_{X-1,Y,t},M_{X,Y,t-1},M_{X,Y,t-1}]_{MEDIAN}.$$

Figure 4B:
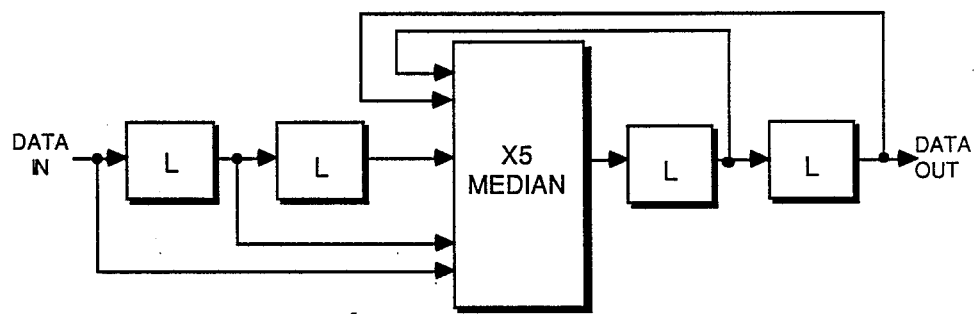
FIG. 4b is a block diagram showing a 5X median 2X recursive filter.
Figure 4C:
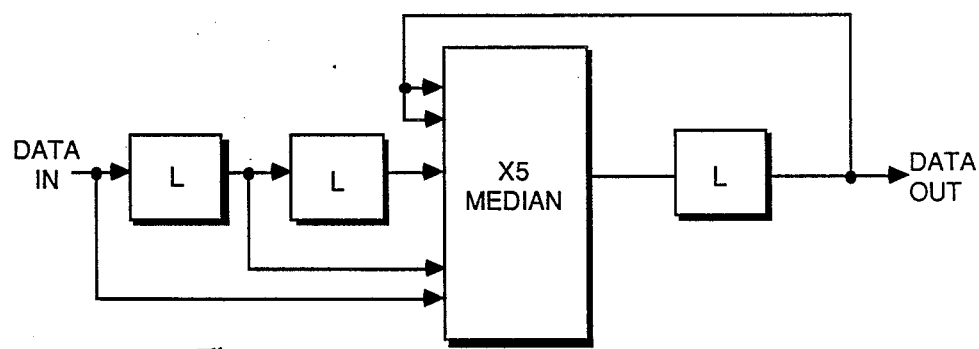
FIG. 4c is a block diagram showing a 5X median 1X recursive double weighted filter.

A simulation was created to test the improvements obtained from a variety of architecture. Table 1 lists the configurations tested and the r.m.s. noise measured on the test waveform. The test waveform was the recorded data obtained from a horizontal line of the digital data from the LANTIRN FLIR system. This data represents a type of imaging information on which improvements in noise filtering techniques are highly sought. Filter 1 represents the base line of no filtering. Filters 2 and 3 are classical three wide and five wide median filtering. Note that five wide median results in significantly more filtering but by using more data will affect the high frequency data more. Filter 4, the three wide median with one wide recursive has the equivalent noise filtering of the five wide median. This technique is applied to a five sample median in filters 5, 6 and 7. Filter 5 uses four consecutive data samples along with the most recent median result as inputs to the median calculation. Filter 7 uses three consecutive data samples combined with the last median result weighted twice. The 5X filters are shown in FIGS. 4a, 4b and 4c.

ADAPTIVE RECURSIVE MEDIAN (ARM) FILTERING

This data suggests that a final optimum filter configuration might be that shown in FIGS. 5a, 5b and 5c. FIG. 5a illustrates a combined spatial domain ARM filter 80 followed by a time domain ARM filter 90. FIGS. 5b and 5c show detailed block diagrams of the individual filters. The maximum dimension in the example filters is shown as seven. This may be made any dimension subject to hardware constraints and high frequency content required. The dimension of the filter can be made variable depending on a parameter like AGC system gain. When the gain is low, noise is o expected to be low and the filter dimension could be made small to permit maximum frequency response through the system. Then when the gain is high and thus noise is high, the filter dimension is made maximum size to permit the greatest filtering possible. This form of adaptive filtering could be conveniently controlled by a microprocessor 100 shown in FIG. 5a.

The imaging system in which the ARM filters are used has an automatic gain control circuit which operates on the analog image data to control the gain as a function of the signal level. The value of this gain can be digitized to a number of levels, such as three levels (low, medium and high). The microprocessor 100 can then include logic for using the digitized gain level to provide a dimension control signal to the ARM filters 80 and 90. If the maximum dimension is seven as shown in FIGS. 5a and 5b, then for a low level of gain, the filters would be controlled to operate as 3X filters as in FIG. 1b for the spatial domain filter, and not shown for the time domain filter. For a medium level of gain, the filters would be controlled to operate as 5X filters as in FIG. 4c for the spatial domain filter, and FIG. 3 for the time domain filter. For a high level of gain, the filters would be controlled to operate as 7X filters as in FIG. 5b for the spatial domain filter, and FIG. 5c for the time domain filter.

It is apparent that there are many possible configurations for each of the filters of FIG. 5a. The spatial domain arm filter can have three pixel delay units in tandem between the video in line 81 and the select unit 86, and one pixel delay unit 88 between the select unit 86 and the video out line 91 as shown in FIG. 5b to provide a 7X median, 1X recursive triple weighted filter, which for medium gain becomes a 5X median, 1X recursive double weighted filter like in FIG. 4c, and for low gain becomes a 3X medium 1X recursive filter like in FIG. 1b. Or it could have three pixel delay units in tandem for both before and after the select unit 86, which for high gain would be a 7X median 3X recursive filter, for medium gain it would be a 5X median 2X recursive as in FIG. 4b, and for low gain it would be a 3X median 1X recursive as in FIG. 1b. There could also be two pixel delay units following the select unit 86, with one providing double weight for a 7X median filter at high gain.

The two domain ARM filter of FIG. 5a is expected to provide at least a factor of five improvement in signal to noise. This configuration is undergoing further tests to determine the actual effect of such a series of filters. The production LANTIRN navigation pod contains a combined time domain ARM filter. The filter dimension is programmable from 1X to 9X with current software selecting 5X filtering under all conditions. The LANTIRN production Target Pod also contains this embodiment an switches filter dimension based on system gain and mode of operations.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A recursive median filter comprising:
   a source of data in the form of samples, with each sample having a value representing a signal level;
   a selection unit having a given number of input ports and one output port, with each input port adapted to receive one sample of data, the input ports being divided into a first set comprising at least two input ports and a second set comprising at least one input port, logic means in the selection unit for comparing the values of the samples at the input ports and for selecting a median sample value and supplying said median sample value to the output port;
   input means coupling said source to said input ports of the first set to supply neighboring samples to said input ports, recursive means coupling the output port to said input port(s) of the second set to provide recursive sample(s).

2. A recursive median filter according to claim 1, wherein said data is image organized in successive frames, the samples being pixels, with the frames organized into a plurality of rows (Y), with each row comprising a plurality of pixels (X).

3. A recursive median filter according to claim 2, further including processing means having an input from a source of gain control signals and an output coupled to the selection unit to control the number of said input ports which have their signals compared by the logic means, said control being a function of a level of the gain control signals.

4. A recursive median filter according to claim 2, wherein the input means includes means to provide the samples of the first set from adjacent samples of a row in the same frame, and the recursive means provides the sample(s) of the second set in that same frame, so that the filter operates in a spatial domain.

5. A recursive median filter according to claim 2, wherein the recursive means includes means for storing a full frame of samples, and at least one of the input ports of the second set is supplied with a sample from a preceding frame at the same position (XY) as one of the samples of the first set, so that the filter operates in a time domain.

6. A recursive median filter according to claim 5, wherein the second set comprises a plurality of input ports, and wherein at least some of the input ports of the second set are coupled in parallel to provide multiple weighting for the recursive signals.

7. A recursive median filter according to claim 5, wherein the input means includes means for storing at least one full frame of samples, and the input ports of the first set are supplied with samples from successive frames at the same position (XY).

8. An adaptive recursive median filter comprising:
a source of data in the form of samples, with each sample having a value representing a signal level, said data being image organized in successive frames, the samples being pixels, with the frames organized into a plurality of rows (Y), with each row comprising a plurality of pixels (X);
a spatial domain filter and a time domain filter coupled in tandem between said source and a video data output line;
wherein the spatial domain filter and the time domain filter each comprise an adaptive recursive median filter having a selection unit with a given number of input ports and one output port, with each input port adapted to receive one sample of data, the input ports being divided into a first set comprising at least four input ports and a second set comprising at least three input ports, logic means in the selection unit for comparing the values of the samples at the input ports and for selecting a median sample value and supplying said median sample value to the output port, and input means coupling said source to said input ports of the first set to supply neighboring samples to said input ports of the first set, recursive means coupling the output port to said input port(s) of the second set to provide recursive sample(s);
wherein the spatial domain filter further has its said input means including means to provide the samples of the first set from adjacent samples of a row in the same frame, and the recursive means provides the samples of the second set in that same frame;
wherein the time domain filter further has its said recursive means including means for storing a full frame of samples, and at least one of the input ports of the second set is supplied with a sample from a preceding frame at the same position (XY) as one of the samples of the first set;
processing means having an input from a source of gain control signals and an output coupled to both the spatial domain filter and the time domain filter to control the number of input ports in each which have their signals compared by the logic means, said control being a function of a level of the gain control signals.

9. A recursive median filter according to claim 8, wherein the spatial domain filter and the time domain filter each have at least some of the input ports of the second set coupled in parallel to provide multiple weighting for the recursive signals.

* * * * *

UNITED STATES PATENT AND TRADEMARK OFFICE
CERTIFICATE OF CORRECTION

PATENT NO. : 4,928,258

DATED : May 22, 1990

INVENTOR(S) : Roger A. May

It is certified that error appears in the above-identified patent and that said Letters Patent is hereby corrected as shown below:

Col 3, line 63, "24" should be ---2---.

Col 4, line 51, "J6" should be ---36---.

Col 5, line 46, "is o expected" should be ---is expected---.

Col 6, line 32, "an" should be ---and---.

Signed and Sealed this

Eighteenth Day of February, 1992

Attest:

HARRY F. MANBECK, JR.

Attesting Officer

Commissioner of Patents and Trademarks